United States Patent [19]

Ikezi et al.

[11] Patent Number: 5,118,969

[45] Date of Patent: Jun. 2, 1992

[54] MULTIPLE PULSE GENERATOR USING SATURABLE INDUCTOR

[75] Inventors: Hiroyuki Ikezi, Rancho Santa Fe; John S. deGrassie, Encinitas, both of Calif.

[73] Assignee: General Atomics, San Diego, Calif.

[21] Appl. No.: 478,106

[22] Filed: Feb. 9, 1990

[51] Int. Cl.⁵ .......................... G11C 13/02; H02J 3/10
[52] U.S. Cl. ................................. 307/419; 307/106; 333/20
[58] Field of Search .................. 307/419–421, 307/415, 414, 104, 106–109, 314; 333/20; 328/65, 67; 363/90–93; 323/290, 240, 261, 262, 305–317, 362

[56] References Cited

U.S. PATENT DOCUMENTS

| | | | |
|---|---|---|---|
| 2,719,237 | 9/1955 | Krienen | 307/106 |
| 3,100,820 | 8/1963 | Svala et al. | 333/20 |
| 3,484,619 | 12/1969 | Proud, Jr. | 333/20 |
| 3,983,416 | 9/1976 | Cronson | 307/260 |
| 4,275,317 | 6/1981 | Laudenslager et al. | 307/415 |
| 4,667,161 | 5/1987 | Wilcox | 328/65 |
| 4,849,649 | 7/1989 | Roche et al. | 307/108 |

OTHER PUBLICATIONS

Melville, W. S., "The Use of Saturable Reactors as Discharge Devices for Pulse Generators", *Proc. IEE* (London), vol. 98, Part III, 185–207 (1951).

Raskin et al., "Metallic Glasses: A Magnetic Alternative", *IEEE Spectrum*, pp. 28–31 (Nov. 1981).

Stockton et al., "Pulsed Power Switching Using Saturable Core Inductors", *J. Appl. Phys.*, vol. 53 (3), 2765–2767 (Mar. 1982).

Birx et al., "Technology of Magnetically Driven Accelerators", *IEEE Transactions on Nuclear Science*, vol. NS-32, No. 5, pp. 2743–2747 (Oct. 1985).

Primary Examiner—A. D. Pellinen
Assistant Examiner—David Osborn
Attorney, Agent, or Firm—Fitch, Even, Tabin & Flannery

[57] ABSTRACT

A high power multiple pulse generator includes a plurality of transmission line sections, adjacent sections of which are coupled together by a saturable inductor. One transmission line section is switchably connected to a load impedance through an output switch. With the output switch open, the coupled transmission line sections are charged to a desired voltage potential. A burst of multiple pulses is generated by closing the output switch, causing the charge on the transmission line section connected to the load through the closed switch to be delivered to the load as a first pulse. This first pulse has an amplitude equal to one half of the charging potential and a duration that is a function of the length of the transmission line section. Once this first pulse is delivered to the load, a voltage is developed across the saturable inductor coupling the discharged transmission line section with an adjacent charged transmission line section, causing current to flow therethrough. When the current flowing through the inductor reaches a certain amplitude, the saturable inductor saturates, effectively transferring the charge of the next transmission line section to the load as a second pulse. The interval between the first and second pulses is a function of the saturation time of the saturable inductor. This process continues with the number of pulses delivered to the load being equal to the number of transmission line sections.

20 Claims, 3 Drawing Sheets

MULTIPLE PULSE GENERATOR USING SATURABLE INDUCTOR

BACKGROUND OF THE INVENTION

The present invention relates to pulse generators that generate a burst of high energy, high frequency pulses. More particularly, the present invention relates to a high frequency multiple pulse generator using sections of a transmission line that are coupled to each other by way of a saturable inductor.

In the operation of a spiral induction accelerator, there is a need for a high energy pulse burst generator that generates pulses having an energy on the order of 1000 joules at a pulse rate of 10 MHz or greater. Unfortunately, there is no known generator that can produce such high energy pulses at such a high frequency. The present invention advantageously provides such a generator, as well as a pulse generator that can be used for other high energy applications.

SUMMARY OF THE INVENTION

In accordance with one aspect of the present invention, a high power multiple pulse generator is provided that includes a plurality of transmission line sections, adjacent sections of which are coupled together by a saturable inductor. One transmission line section (the "last" transmission line section of this plurality of transmission line sections) is switchably connected to a load impedance through an output switch. The load impedance matches the characteristic impedance of the transmission line sections. Prior to closing the output switch, the coupled transmission line sections are charged to a desired voltage potential. When a burst of multiple pulses is desired, the output switch is closed, causing the charge on the last transmission line section to be delivered to the load as a first pulse having an amplitude equal to one half of the charging potential and having a duration that is a function of the length of the last transmission line section. Once this first pulse is delivered to the load, a voltage is developed across the saturable inductor that couples the last transmission line section to the next-to-last transmission line section, causing current to flow therethrough. The current increases in value until it causes the saturable inductor to saturate, effectively transferring the charge of the next-to-last transmission line section to the load as a second pulse. The interval between the first and second pulses is a function of the saturation time of the saturable inductor. This process continues with the number of pulses delivered to the load being equal to the number of transmission line sections.

An alternative embodiment of the invention includes a Blumlein configuration that allows the pulse amplitude to be approximately equal to the charging potential.

Advantageously, the number of pulses in the pulse burst produced at the load is controlled by the number of transmission line sections connected together via the saturable inductors. The pulse width is a function of the length of the transmission line sections. The pulse spacing (i.e., the pulse burst frequency) is a function of the saturation time of the saturable inductors. The pulse amplitude is a function of the voltage potential used to charge the transmission line sections prior to closing the output switch. Because all of these parameters are readily controllable through simple means, the present invention thus provides a multiple pulse generator that can be easily adjusted to provide a desired number, amplitude, and frequency of high power pulses.

An additional embodiment of the invention utilizes discrete L-C components in combination with, or as a substitute for, the individual transmission line sections, thereby providing for the generation of a wider pulse width than is possible using reasonable lengths of transmission line sections.

As will be apparent to those skilled in the art, the saturable inductor that couples adjacent transmission line sections in accordance with the present invention performs the function of a switch that automatically connects a charged transmission line section to an adjacent discharged transmission line section at an appropriate time, thereby transmitting the pulses toward the load. Once a particular saturable inductor is saturated, it remains saturated, thereby allowing additional pulses to smoothly propagate through the saturated inductor(s) to the load. This action creates a plurality of pulses at the load, with each pulse representing the charge on a respective transmission line section as that charge eventually reaches the load.

Hence, a first embodiment of the invention may be characterized as a pulse burst generator that delivers a burst of a prescribed number of high energy pulses to a load. Such a pulse-burst generator includes: (1) a plurality of transmission line sections, each of the transmission line sections having a characteristic impedance approximately equal to the load impedance; (2) first switching means (e.g., the saturable inductor(s)) for connecting adjacent ones of the plurality of transmission line sections, this first switching means presenting a high impedance connection between adjacent ones of the plurality of transmission line sections when open, and a low impedance connection when closed, the opening and closing of the first switching means being a function of the current flowing therethrough; (3) charging means for charging each of the transmission line sections to a prescribed voltage potential; and (4) second switching means (e.g., the output switch) for selectively connecting a first transmission line section of the plurality of transmission line sections to the load after the charging means has charged the transmission line sections to the prescribed voltage.

In operation, this first embodiment develops across the load at the time the second switch means connects the first transmission line section to the load. The pulse width of this first pulse is a function of the length of the first transmission line section. The pulse amplitude of this first pulse is a function of the voltage potential to which each of the transmission line sections are charged. After this first pulse is developed across the load, the first transmission line section becomes discharged, i.e., it is no longer charged to the prescribed voltage. Hence, a first voltage is developed across the first switching means connecting a charged and a discharged transmission line section. This first voltage causes a sufficiently high current to flow through the first switching means to close the first switching means within a given switching time. When closed, the first switching means thereby effectively transfers the voltage potential on the charged transmission line section to the discharged transmission line section, thereby passing the charge from one transmission line section to the other. As these charges are thus passed from one transmission line section to the next, they are passed to the load. Thus, a series of pulses are developed at the load, with each pulse being developed one switching time subsequent to the prior pulse, and with the number of pulses being equal to the number of transmission line sections used.

It is to be emphasized that while the preferred manner of implementing the first switching means or equivalent, the first and subsequent embodiments of the invention comprises one or more saturable inductors, other types of switching means may also be employed. Any type of switch that will allow a high energy pulse to pass therethrough upon being triggered at an appropriate time may perform the function of the first switching means. For example, a photoconductor switch that is triggered with a light pulse, coupled with means for generating the light pulse at an appropriate time, could be used in lieu of the saturable inductor(s).

A second embodiment of the invention contemplates the recurring generation of a burst of pulses. Such second embodiment may be characterized as a pulse burst generator that comprises: (1) a plurality of transmission line sections, each having substantially the same characteristic impedance; (2) automatic coupling means for coupling adjacent ones of the transmission line sections, thereby forming a series combination of the transmission line sections, this coupling means coupling the transmission line sections via a high impedance connection when the current flowing through the series combination is low, and a low impedance connection when the current flowing through the series combination is high; (3) switch means for selectively connecting a first section of the series combination to a load, where the load has an impedance approximately equal to the characteristic impedance of the transmission line sections; (4) means for charging the series combination to a prescribed voltage potential; and (5) control means for selectively activating the switch means at a time subsequent to the charging of the series combination to connect the first section of the series combination to the load, thereby causing a burst of pulses to be delivered to the load from the charged series combination; and for selectively deactivating the switch means after the burst of pulses has been delivered to the load to disconnect the first section of the series combination from the load, thereby allowing the series combination to again be charged to the prescribed voltage in anticipation of the next delivery of a burst of pulses to the load.

A third embodiment of the present invention encompasses a method of generating a burst of high power pulses at a high frequency, e.g., 10 MHz or greater. This method is characterized by the following steps: (a) connecting a prescribed number of transmission line sections and saturable inductors (or equivalent switch means) to form a series combination, with one saturable inductor being present in the series combination between adjacent transmission line sections; (b) charging the series combination to a prescribed voltage; and (c) connecting the series combination, after being charged to the prescribed voltage, to a desired load. As this last step is completed, the charge in the series combination is transferred to the load in pulses, with a first pulse comprising the charge held in a first transmission line section adjacent the load, a second pulse comprising the charge held in a second transmission line section coupled to the load through a first saturable inductor and the first transmission line section, and so on, with the number of pulses being equal to the number of transmission line sections in the series combination.

It is a feature of the present invention to provide a simple, reliable, multiple pulse generator that produces a burst of high energy, high frequency pulses.

It is a further feature of the invention to provide such a pulse generator wherein the number of pulses in each burst, their frequency, and their amplitude may be readily adjusted to suit the needs of a particular application.

It is another feature of the invention to provide a simple and reliable pulse burst generator system that generates a burst of high energy, high frequency pulses at a desired repetition rate.

It is still another feature of the invention to provide such a pulse generator that is realized using a series combination of transmission line sections, or the electrical equivalent of transmission line sections realized with discrete inductors and capacitors, charged to a desired potential, with a last section being switchably connected to a desired load, and with adjacent sections being connected through respective saturable inductors. In such configuration, it is a feature of the invention that the interval between pulses is controlled by the saturation time of the saturable inductor, the duration of each pulse is controlled by the propagation delay through each transmission line section, and the amplitude of each pulse is controlled by the amplitude of the potential charge placed on the transmission line sections.

A further feature such pulse generator, in accordance with one embodiment thereof, is that the amplitude of each pulse generated by the pulse generator is approximately the same as the amplitude of the voltage potential to which the individual transmission line sections are charged.

Yet another feature of such pulse generator, in accordance with one embodiment thereof, is that the propagation delay through each transmission line section is selectively adjusted using discrete inductors and capacitors as part of each transmission line section.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the appended claims.

Figure 1:
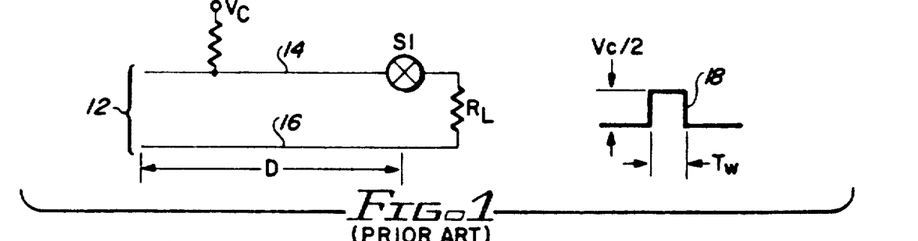
FIG. 1 shows a schematic diagram of a prior art single-pulse generator realized using a transmission line.

Referring first to FIG. 1, a schematic diagram of a prior art single-pulse generator realized using a transmission line 12 is shown. The transmission line 12 has a length D, and includes two conductors 14 and 16. One end of both conductors (the left end as shown in FIG. 1), is open. The other end of conductor 14 is connected to a switch S1. The switch S1 is connected to a load $R_L$, as is the other end of conductor 16. With the switch S1 open (conductor 14 not connected to $R_L$), the conductor 14 is charged to a voltage potential $V_c$ relative to conductor 16. When a pulse is desired at the load $R_L$, the switch S1 is closed. The closing of switch S1 connects the load $R_L$ to the charged transmission line 12, causing a pulse 18 to be developed across the load $R_L$. If the load $R_L$ matches the characteristic impedance of the transmission line, Z, then the amplitude of the pulse 18 is one half of the charging voltage, or $V_c/2$. The duration of the pulse 18 is the round trip time of the signal in the transmission line. This round trip time may be expressed as a pulse width, $T_w$, which is $$T_w = 2D/u \qquad (1)$$

where u is the signal speed. For most transmission lines, the signal speed is approximately the speed of light, or $3 \times 10^8$ m/sec. Thus, for example, a transmission line having a length of 1.5 meters would thus produce a pulse at the load $R_L$ having a pulse width of approximately 10 nanoseconds.

Figure 2:
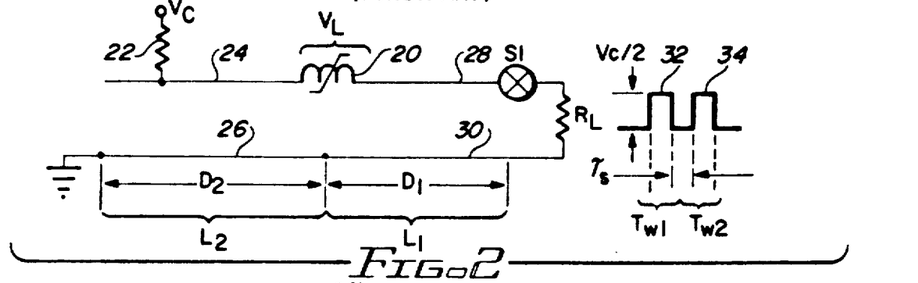
FIG. 2, is a schematic diagram of a two-pulse generator made using two sections of transmission line joined by a saturable inductor in accordance with one embodiment of the present invention.

Referring next to FIG. 2, a schematic diagram of a two-pulse generator made in accordance with one embodiment of the present invention is illustrated. This embodiment comprises two sections of transmission line $L_1$ and $L_2$, having lengths of $D_1$ and $D_2$ respectively. The transmission line section $L_1$ includes a conductor 24 and a conductor 26. The transmission line section $L_2$ also includes a conductor 28 and a conductor 30. The conductors 24 and 28 are joined by a saturable inductor 20. The conductors 26 and 30 are directly connected together and grounded. Both the conductors 24 and 28 are charged to the voltage $V_c$. Conventional means may be used to perform such charging, schematically represented in FIG. 2 as simply a resistor 22 connected to conductor 24 and to the voltage potential $V_c$. (Note, that given sufficient charging time, the charging of conductor 24 to the voltage potential $V_c$ also charges conductor 28 to the voltage potential $V_c$ as the inductor 20 electrically connects these two conductors.) As with the single pulse generator of FIG. 1, a switch S1 connects the conductor 28 of the two-pulse generator of FIG. 2 to a load $R_L$. The return path from the load $R_L$ is provided through the conductors 30 and 26.

In operation, the closing of switch S1 connects the load $R_L$ to the charged transmission line section $L_1$, causing a first pulse 32 to be developed across the load $R_L$ in the same manner as the single pulse 18 was generated by the single-pulse generator described above in connection with FIG. 1. If the load impedance $R_L$ matches the impedance of the transmission line section $L_1$, the first pulse 32 has an amplitude that is one half of the charging voltage, or $V_c/2$. The duration or width of the pulse 32 is $T_{w1}$, which is approximately $$T_{w1} = 2D_1/u \qquad (2)$$

where $D_1$ is the length of the transmission line section $L_1$, and u is the signal speed.

At the instant the switch S1 is closed, and the first pulse 32 is developed across the load $R_L$, the voltage developed across the inductor 20 is essentially zero, as the same voltage potential $V_c$ appears on both sides of the inductor 20. Hence, very little, if any, current initially flows through the inductor 20, and the inductor 20 represents a high impedance that effectively isolates conductor 28 from conductor 24. In other words, when the first pulse 32 is being delivered to the load $R_L$, it is as though the conductor 28 of the first transmission line section $L_1$ is not connected to the conductor 24 of the second transmission line section $L_2$. However, at a time $t = D_1/u$, where $t = 0$ is the time when the switch S1 is first closed, the voltage on the load side of inductor 20 (the right side as drawn in FIG. 2) drops to zero, thereby causing the voltage across the inductor 20, $V_L$, to become approximately $V_c$. Hence, a current, I, begins to flow through the inductor 20 according to expression:

$$I = V_c(t - D_1/u)/L \qquad (3)$$

where $V_c$ is the voltage potential (in volts) to which conductor 24 has been charged, L is the value of the inductor 20 before saturation (in henries), and t is time (in seconds).

When the current flowing through the saturable inductor 20 exceeds a critical value $I_s$ (the saturation current), the magnetic core of the inductor saturates, causing the value of the inductance to suddenly drop to a very small value, $L_s$. Once saturation occurs, the high impedance of the inductor 20 suddenly switches to a low impedance, thereby effectively connecting the conductor 24 to the conductor 28. The effect of saturation is sufficiently sudden to be comparable to a switch closure, i.e., prior to saturation it is as though conductor 28 of the first transmission line section $L_1$ is not connected to conductor 24 of the second transmission line section $L_2$. After saturation, it is as though conductor 28 is connected directly to conductor 24, thereby allowing the charge $V_c$ on conductor 24 to be transferred to conductor 28.

The transfer of the charge $V_c$ from the second transmission line section $L_2$ to the first transmission line section $L_1$ causes a second pulse 34 to be delivered to the load $R_L$. This second pulse 34 has a pulse duration or width of $T_{w2}$ which (assuming equal lengths of transmission line sections, i.e., assuming $D_1 \simeq D_2$) is approximately the same as the width of the first pulse $T_{w1}$. The interval between the two pulses 32 and 34 is the saturation time, $\tau_s$, of the saturable inductor 20, expressed as $$\tau_s = I_s L / V_c . \tag{4}$$

The rise time, $\tau_r$, of the pulse 34 may be expressed as $$\tau_r = L_s / Z , \tag{5}$$

where $L_s$ is the value of the inductor 20 after saturation, and Z is the characteristic impedance of the transmission line sections.

Figure 3:
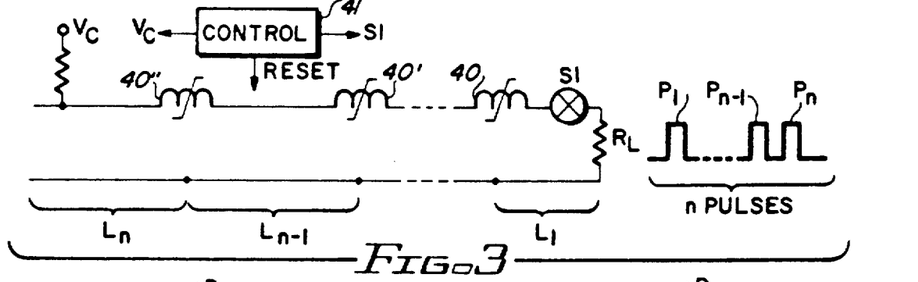
FIG. 3 is a schematic diagram of an n-pulse generator made in accordance with the present invention.

Referring next to FIG. 3, a multi-pulse generator made in accordance with the present invention is illustrated. This multi-pulse generator includes n transmission line sections, $L_1, L_2, \ldots L_{n-1}, L_n$, connected in series. Each transmission line section includes two conductors as described above with reference to the transmission line sections of FIG. 2. A first saturable inductor 40 connects a first transmission line section $L_1$ to a second transmission line section $L_2$ in the same manner as described above in FIG. 2. Additional saturable inductors connect adjacent transmission line sections in a similar manner. Thus, e.g., a saturable inductor 40' connects the transmission line section $L_{n-2}$ to the transmission line section $L_{n-1}$, and a saturable inductor 40" connects the transmission line section $L_{n-1}$ to a last transmission line section $L_n$. A switch S1 connects the transmission line section $L_1$ to a load $R_L$. With the switch S1 open, each of the transmission line sections $L_1, L_2, \ldots L_n$ are charged to a desired voltage potential $V_c$ using conventional charging means. When the switch S1 is closed, n pulses, $P_1, P_2, \ldots P_{n-1}, P_n$, are delivered to the load $R_L$. The first two pulses are generated as described above in connection with FIG. 2. Additional pulses are generated in a similar manner, with the charge of a given transmission line section being passed to the adjacent transmission line section as soon as a voltage is developed across the saturable inductor that connects the two transmission line sections. Eventually, the charge of the last transmission line section $L_n$ is passed through all of the saturable inductors and transmission line sections to the load $R_L$, causing the last pulse, $P_n$, to appear across the load $R_L$.

The amplitude of the n pulses produced by the multi-pulse generator shown in FIG. 3 is $V_c/2$. The pulse width and pulse separation is, assuming equal lengths of transmission line sections, defined as expressed above in Equations (2) and (4), respectively. The rise time is as expressed above in Equation (5). As all of these parameters are readily adjustable, e.g., by selecting the charging potential $V_c$, and the type of core and inductance value of the saturable inductors, a highly versatile and adaptable high-energy multi-pulse generator is provided.

Also shown in FIG. 3 is a control unit 41. The control unit 41 may be used to generate the appropriate control and other signals that allow the pulse generator to provide varying and/or recurring bursts of pulses. For example, once a first burst of pulses is provided, the control unit 41 may selectively apply the charging potential $V_c$ to the transmission line sections in anticipation of generating a second burst of pulses. Once charged, the control unit may also generate an appropriate control signal that triggers (closes) the switch S1, and that opens the switch (if necessary), after delivery of the pulses to the load. Further, as explained below, some types of saturable inductors may require that they be reset prior to the generation of the next burst of pulses. If so, the control unit 41 may provide such reset signal. Advantageously, all of these signals may be appropriately synchronized, or otherwise timed relative to each other, so that a recurring, e.g., periodic, generator of pulse bursts is realized.

The switch S1 may be realized using conventional switch means adapted for switching a pulse of high energy. Depending upon the voltage level to be switched, representative switches include a silicone controlled rectifier (SCR), a spark gap switch, a photo conductor switch, or a Thyratron. A spark gap switch is particularly well suited for this type of invention as it automatically triggers when the voltage applied thereacross (i.e., the charge placed on the transmission lines sections) reaches a prescribed threshold level. A spark gap switch can also be triggerable by an external pulse, if desired.

As is known to those skilled in the art, a saturable inductor, such as the saturable inductor 20 shown in FIG. 2, or the saturable inductors 40, 40' and 40" shown in FIG. 3, comprise a magnetic core and a coil of at least one winding encircling the magnetic core. The magnetic cores are preferably toroidal magnetic cores having a large aspect ratio. The average circumference length of the toroidal core is l and the cross section is a. The number of turns of a conductor wire wound on the core is N. The non-saturated inductance of the saturable inductor made from a toroidal core is a function of the magnetic core properties, i.e., the average circumference length l, the cross section a, and the number of turns N. This inductance may be expressed as $$L = \mu N^2 a / l \tag{6}$$

where $\mu$ is the magnetic permeability (a function of the core material). When saturation occurs, all of these parameters remain the same, except for the magnetic permeability, which changes at saturation to a much smaller value $\mu_s$. The value of $\mu_s$ is also a function of the type of core material, and if not known, may be determined empirically. Typically, the value of $\mu_s$ is found to be a few times the vacuum permeability. Thus, the saturated inductance, $L_s$ may be expressed as $$L_s = \mu_s N^2 a / l \tag{7}$$

The magnetic induction, B, within a coil of N turns carrying a current, I, is also known and may be expressed as $$B = \mu N I / l. \tag{8}$$

This magnetic induction B is related to magnetic intensity H by a proportionality constant, referred to as the magnetic permeability. More particularly, the relationship between B and H may be expressed as $$B = \mu H. \tag{9}$$

The relationship between B and H, frequently referred to the B-H characteristics, may be considered as a transfer function that relates the particular value of H for a given core material to a particular value of H. As evidenced from Equation (9) above, this transfer function is simply the magnetic permeability. That is, if the B-H characteristics are plotted, with B on the horizontal axis and H on the vertical axis, the slope of the B-H curve is simply $\mu$.

For a saturable inductor, there are two values of $\mu$, a large value (steep slope of the B-H curve) when the core is not saturated, and a much smaller value (gradual, nearly flat, slope of the B-H curve) when the core is saturated. As the value of B is directly proportional to the current. I, flowing in the winding of the inductor, there is thus a saturation current (referred to sometimes as a critical current), $I_s$, at which saturation is reached. Thus, once the current flowing in the saturable inductor reaches $I_s$, the inductance of the saturable inductor suddenly drops from a value L (a large value that provides a high impedance, much like an open switch), to a value $L_s$ (a low value that provides a low impedance, much like a closed switch).

Figure 4A:
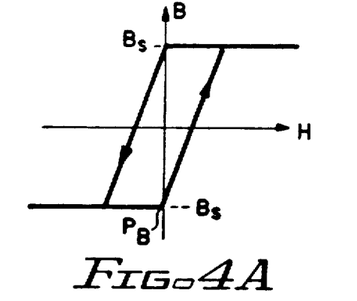
FIGS. 4A and 4B are schematic representations of the B-H characteristics of a saturable inductor with and without hysteresis, respectively.
Figure 4B:
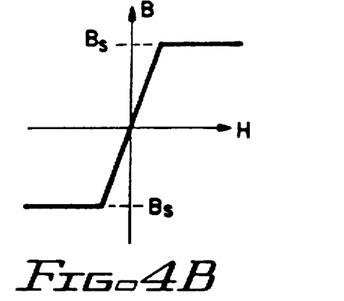

It is noted that two types of saturation are possible—with and without hysteresis. These two types of saturation are illustrated in the magnetization curves (B-H characteristics) shown in FIGS. 4A and 4B, which figures respectively show schematic representations of the B-H characteristics of a saturable inductor with hysteresis and without hysteresis. The saturation current. $I_s$, depends upon which type of saturation is employed. Where hysteresis is present, the core must be reset, i.e., the initial state of the core must be set to a point $P_B$ on the B-H curve of FIG. 4A where $H=0$ and $B=-B_s$, where $-B_s$ is the negative saturation value of the magnetic induction. Such resetting can readily be accomplished by using conventional means, such as by placing a secondary reset winding on the toroidal core, and pulsing such secondary winding with a suitable current pulse. Alternatively, resetting may be accomplished by pulsing the existing winding with a current of the appropriate polarity. Where hysteresis is not present, as shown in FIG. 4B, resetting is not required, and the initial state of the core will be the origin ($H=0$, $B=0$).

The saturation current, i.e., the amount of current required to move from the initial state of the core (corresponding to the saturable inductor switch being "open") to a saturated state of the core (corresponding to the saturable inductor switch being "closed") may be expressed as $$I_s = \{2\}B_s l/\mu N \quad (10)$$

where the number within braces {} should be included when the model having hysteresis is employed, but should be neglected when the model not having hysteresis is employed.

The core saturation time may thus be found by substituting Equation (10) into Equation (4), and arriving at $$\tau_s = \{2\}NaB_s/V_c \quad (11)$$

Further, in order to have clearly defined pulses, it is necessary that the rise time $\tau_T$ should be much shorter than the interval between pulses, $\tau_s$. This condition will be satisfied when $$\frac{\{4\}B_s^2 la}{\mu_s} >> \frac{V_c^2}{Z}\tau_s \quad (12)$$

It is further noted that the leakage current, i.e., the current before saturation, should be small in order for the saturable inductor to properly perform its function as a switch. Maintaining a small leakage current is quantified by the condition that the voltage developed in the transmission line section due to leakage current, IZ, must be much smaller than the pulse height $V_c/2$. This condition yields $$\frac{2\{4\}B_0^2 la}{\mu} << \frac{V_c^2}{Z}\tau_s \quad (13)$$

From Equation (13), it is seen that when $\tau_s$ is equal to $T_w$ (i.e., the pulse width is equal to the spacing or interval between pulses), that the energy stored in the charged line should be much greater than the energy stored in the magnetic core when saturated. Further, as seen by the two conditions set forth in Equations (12) and (13), the use of magnetic cores having large values of $\mu$ should be used.

From the above description, it is thus evident that specifying the pulse height, voltage, power, pulse width and magnetic material dictates what values should be used for $V_c$, $\tau$, $\tau_s$, Z, $B_s$, $\mu$, and $\mu_s$. Equation (11) determines the value of Na (the number of turns times the cross sectional area of the core), and Equation (12) specifies the minimum volume of the magnetic core la. Other considerations, such as the dielectric strength of the insulating material used in the core windings, further guide the selection of l or a.

Figure 5:
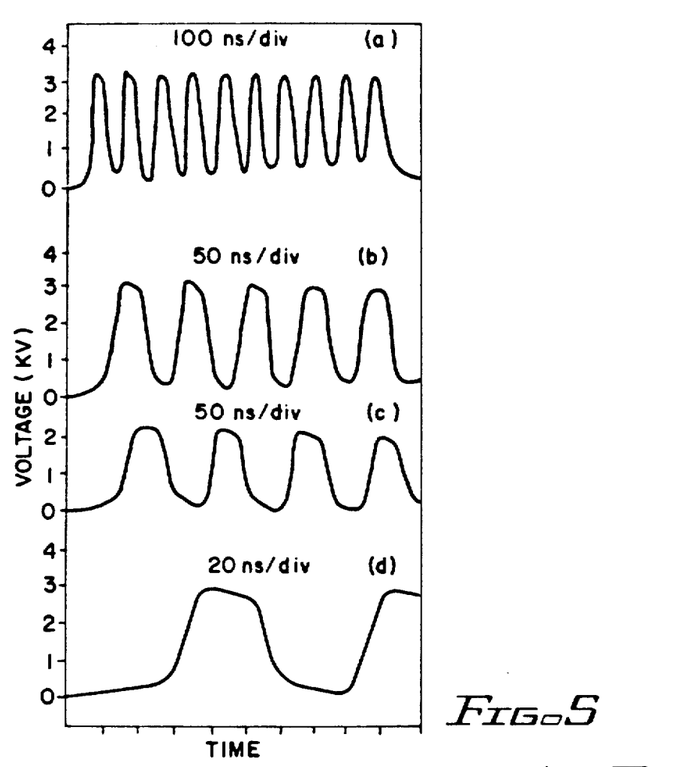
FIG. 5 is a waveform diagram depicting the output waveform obtained from a 10-segment pulse generator made in accordance with the present invention, with varying time scales for the horizontal axis.

Referring next to FIG. 5, a waveform diagram depicting the output waveform obtained from a 10-segment pulse generator made in accordance with the present invention, with varying time scales for the horizontal axis, is illustrated. The charging voltage $V_c$ was chosen to be $V_c=6$ kV. The transmission line sections were realized with conventional 5 m-long RG58A/U cables, providing a pulse width $T_w=50$ ns and a characteristic impedance $Z=50$ $\Omega$, meaning that $R_L$ was also selected to be 50 $\Omega$. The saturable inductors were made using ferrite cores obtained from Ferroxcube, of Los Angeles, California, part 3E2A, having the following characteristics:

$B_s = 0.4$T
$\mu = 5000$
$\mu_s = 2$ (no hysteresis)
$a = 12$ mm $\times$ 6 mm
$l = 70$ mm.

By choosing $T_w=50$ ns, the number of coil turns was determined from Equation (11) as $N=8$. The energy delivered to the load was approximately the same energy of the charged line, and was $V_c^2\tau_s/Z=0.025$ Joule. The energy in the magnetic core when saturated was $B_s^2 la/\mu_s=0.34$ Joule. The energy in the magnetic core when not saturated was $B_0^2 la/\mu=1.3\times10^{-4}$ Joule. These values satisfy the constraints of Equations (12) and (13).

As indicated, a 10 segment system was made as above described. The switch S1 for such 10 segment system was realized with a conventional spark gap switch. The breakdown voltage of the spark gap switch was made equal to $V_c$ by changing the nitrogen pressure at the spark gap.

FIG. 5 shows graphical representations of the actual waveforms observed using the 10 segment pulse generator described above. Some minor discrepancies between measured values and predicted values, e.g., as in the value of the pedestal height before the pulse starts rising, may be attributable to the dynamic permeability of the core (with this value being smaller than the low frequency value of μ), and the eddy currents induced in the magnetic core.

Figure 6:
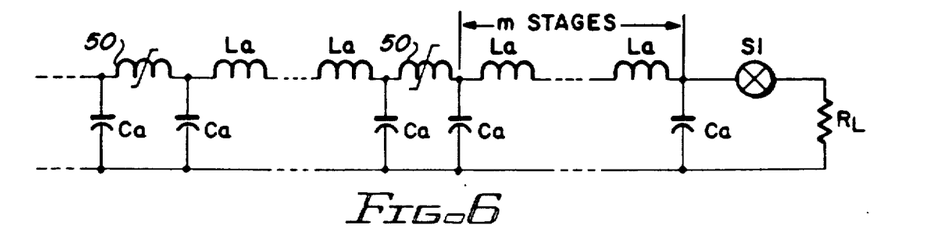
FIG. 6 is a schematic diagram of a pulse generator in accordance with another embodiment of the present invention realized using discrete components instead of transmission line segments, which embodiment allows the pulses to be longer than is possible using reasonable lengths of transmission line segments.

Referring next to FIG. 6, an alternative embodiment of the present invention is illustrated. In this alternative embodiment, the transmission line segments are realized using discrete inductors $L_a$ and discrete capacitors $C_a$. The inductors $L_a$ and the capacitors $C_a$ are configured to form the schematic equivalent of a transmission line segment. The inductors and capacitors thus form a simulated transmission line segment. As with the embodiment shown in FIG. 3, each simulated segment is connected to an adjacent simulated segment by means of a saturable inductor 50. A last stage is connected to the load $R_L$ by means of a suitable switch S1. The embodiment shown in FIG. 6 has application whenever the pulses need to be longer than is possible using reasonable lengths of conventional transmission line segments. That is, by appropriately selecting the values of the inductors $L_a$ and the capacitors $C_a$, the signal travel time through each segment can be selectively adjusted to a desired value.

Figure 7:
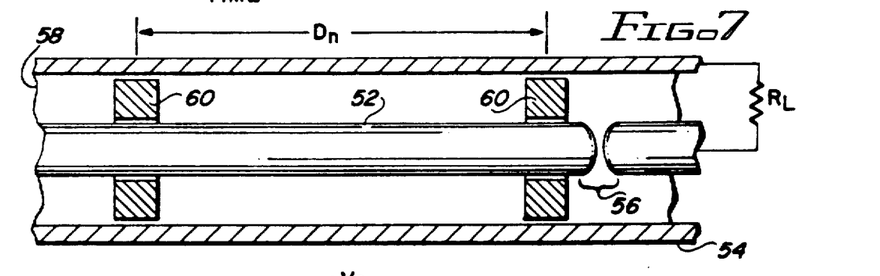
FIG. 7 is a cross section of a high-power pulse generator made in accordance with the present invention wherein the saturable inductors form an integral part of a coaxial transmission line.

FIG. 7 illustrates a cross section of a preferred high-power pulse generator made in accordance with yet another embodiment of the present invention. In FIG. 7, the saturable inductors form an integral part of, e.g. are embedded within, a coaxial transmission line. That is, a plurality of toroidal magnetic cores 60 are selectively inserted into a coaxial cable 58, so as to define respective segments or lengths, $D_n$, of transmission line sections. A center conductor 52 of the coaxial cable 58 passes through the center of each toroidal core 60, thereby effectively forming an inductance of a single turn. Suitable insulating means electrically isolate the cores 60 from the center conductor 52 and an outer conductor 54. A gap 56 in the center conductor 52 near the end of the cable 58 adjacent the load $R_L$ provides a means for switchably connecting a voltage charge placed on the center conductor to the load, similar to a spark gap switch.

The embodiment of FIG. 7 has particular applicability to particle accelerators, or other devices, where very high power pulses are required. For example, the charging voltage used with the embodiment shown in FIG. 7 may be on the order to $V_c = 1$ MV. If $Z = 5 \Omega$, and $T_w = \tau_s = 50$ ns, a significant issue of concern is the volume of the magnetic core. However, by employing nonferrite cores exhibiting hysteresis, e.g. metglass (which has a value of $B_s \simeq 1.2T$), the volume of the core may be reduced to an acceptable value.

Still further improvements may be made by utilizing a Blumlein embodiment of the present invention. A Blumlein embodiment advantageously allows the pulse amplitude delivered to the load to be approximately equal to the voltage potential to which the transmission line is charged, rather than one-half of such charged value.

Figure 8:
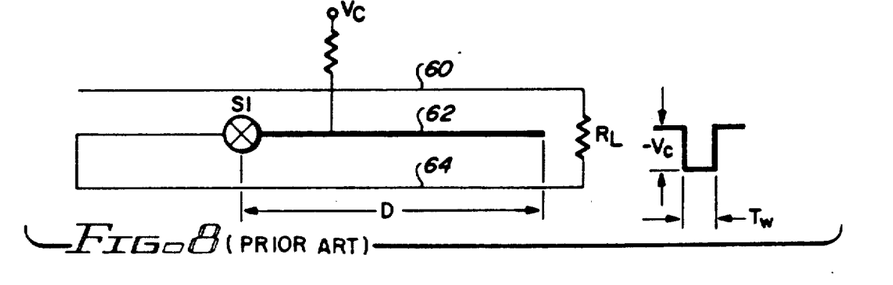
FIG. 8 is a schematic diagram of a prior art single-pulse generator using a Blumlein arrangement.

To better understand the Blumlein embodiment, reference is next made to FIG. 8, where a schematic diagram of a prior art single-pulse generator using a Blumlein arrangement is depicted. The Blumlein arrangement includes three conductors 60, 62 and 64 that form three transmission lines. A first transmission line comprises the conductor 60 and the conductor 62. A second transmission line comprises the conductor 62 and the conductor 64. A third transmission line comprises the conductor 60 and the conductor 64. A switch S1 is placed in the middle of the conductor 62, a distance D from an open end (the right end as shown in FIG. 8) of the conductor 62. The other end (the left end as shown in FIG. 8) of the conductor 62 is connected to the conductor 64. The left end of conductor 60 is left open, and the right ends of conductors 60 and 64 are connected to the load $R_L$.

In operation, the right side of conductor 62, shown as a heavy line in FIG. 8, is charged to a desired voltage potential $V_c$ with respect to the conductors 60 and 64. Upon closure of the switch S1, both the first and second transmission lines transmit the signal to the lines on the left of switch S1. The first line, comprising the conductors 60 and 62, carries the voltage $-V_c/2$; while the lower line, comprising the conductors 62 and 64, carries the voltage $+V_c/2$. (Here, the polarity of the voltage indicates the potential on the upper conductor of the two conductors of the particular transmission line relative to the lower conductor.) The upper conductor 60 is open ended. Hence, the reflected signal remains as $-V_c/2$, as there is no polarity reversal for reflections from an open-ended line. The lower conductor 64 is not open ended, but is shorted to the middle conductor 62. Hence, the reflected signal on the lower conductor changes to $-V_c/2$. The reflected signals or voltages add together and form a signal which propagates through a third transmission line comprising conductors 60 and 64. The amplitude of this signal is $-V_c$ (being equal to the sum of the charges or signals $(-V_c/2)+(-V_c/2)$ from the first and second transmission lines), which is equal to the charging voltage. This signal or voltage reaches the load $R_L$. If the load $R_L$ matches the impedance of the third line, $2Z_0$ (where $Z_0$ is the impedance of the individual first and second lines), the pulse voltage across the load is $-V_c$. The pulse width $T_w$ equals the signal round trip time of the initially charged segment 62.

Figure 9:
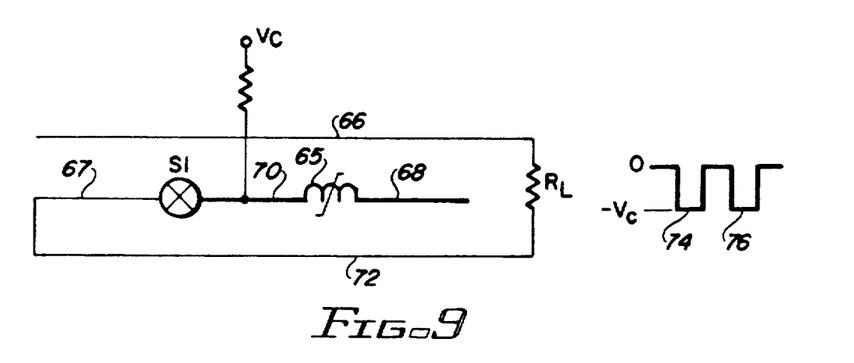
FIG. 9 is a schematic diagram of a two-pulse generator made in accordance with a Blumlein embodiment of the present invention.

Referring next to FIG. 9, a schematic diagram of a two-pulse generator made in accordance with a Blumlein embodiment of the present invention is shown. This arrangement is similar to that shown in FIG. 8 in that it includes three conductors, an upper conductor 66, a middle conductor 67, and a lower conductor 72. A switch S1 divides the middle conductor into two portions. A saturable inductor 65 further divides that portion of the center conductor to the right of the switch S1 into two equal-length segments 68 and 70. Both of these segments 68 and 70 are charged to the desired voltage potential $V_c$ using conventional means while switch S1 is open. Upon closure of the switch S1, the charge on conductor segment 70 propagates to the load in the same manner as described above in connection with FIG. 8, thereby producing a first pulse 74 at the load. After the conductor 70 has discharged, a voltage is developed across the saturable inductor 65, causing current to flow therethrough. When this current reaches a prescribed threshold, the inductor saturates, allowing the charge on the conductor segment 68 to be passed to the conductor segment 70 in the same manner as described previously relative to the other embodiments of the invention described, e.g., in FIGS. 2 and 3. With the charge passed to the conductor segment 70, a second pulse 76 is developed across the load $R_L$ in the same manner as was the first pulse 74. The pulse separation or interval between the pulses 74 and 76 is the core saturation time of the inductor 65. This core saturation time is expressed above in Equation (4).

Figure 10:
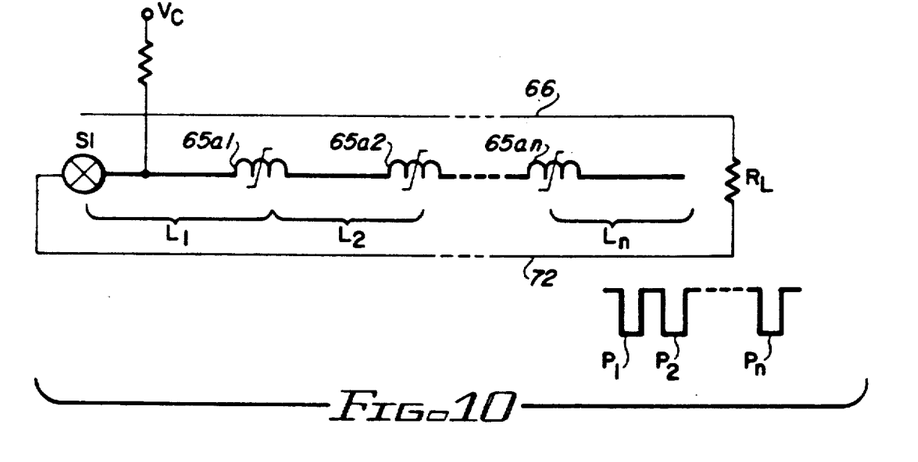
FIG. 10 is a schematic diagram of a multipulse generator made in accordance with the Blumlein embodiment of the present invention.

FIG. 10 shows a schematic diagram of a multipulse generator made in accordance with the Blumlein embodiment of the present invention. This embodiment is essentially the same as the two-pulse generator shown in FIG. 9, except that the portion of the center conductor to the right of the switch S1 is divided into n segments, $L_1, L_2, \ldots L_n$, with a saturable inductor, $65_{a1}, 65_{a2}, \ldots 65_{a(n-1)}$, connecting adjacent segments. Further, because the conductors to the left of the switch only delay the signal beyond the desired delays created by the saturation time of the saturable inductors, and the desired propagation delays created by the selected lengths of the segments $L_1, L_2, \ldots L_n$, the long conductors to the left of the switch are not necessary. Advantageously, with n segments as shown in FIG. 10, a total of n pulses, $P_1, P_2, \ldots P_n$, are developed across the load $R_L$, each having an approximate amplitude of $-V_c$. The various parameters that control the pulse width, pulse separation, rise time, and other considerations associated with selecting an appropriate saturable inductor or length of conductor segment, are the same as previously described.

As described above, it is thus seen that the present invention provides a simple, reliable, multiple pulse generator that produces a burst of high energy, high frequency pulses. Advantageously, the number of pulses in each burst, their frequency, and their amplitude may be readily adjusted to suit the needs of a particular application. Further, any desired repetition rate of the pulse burst can be readily realized.

As further described above, a preferred embodiment of the invention is realized using a series combination of transmission line sections, or the electrical equivalent of transmission line sections (realized, e.g., with discrete inductors and capacitors), charged to a desired potential, with a last section being switchably connected to a desired load, and with adjacent sections being connected through respective saturable inductors. The interval between pulses is controlled by the saturation time of the saturable inductor, the duration of each pulse is controlled by the propagation delay through each transmission line section, and the amplitude of each pulse is controlled by the amplitude of the potential charge placed on the transmission line sections. Further, in a Blumlein embodiment of the invention, the amplitude of each pulse generated by the pulse generator may be approximately the same as the amplitude of the voltage potential to which the individual transmission line sections are charged.

While the invention herein disclosed has been described by means of specific embodiments and applications thereof, numerous modifications and variations could be made thereto by those skilled in the art without departing from the scope of the invention as set forth in the claims.

What is claimed is:

1. A pulse burst generator for delivering a burst of a prescribed number of pulses to a load upon the single closure of a switch connecting said pulse burst generator to said load, said load having a load impedance, said pulse burst generator comprising:
 a plurality of transmission line sections, each of said transmission line sections having a characteristic impedance approximately equal to said load impedance;
 first switching means connecting adjacent ones of said plurality of transmission line sections, said first switching means presenting a high impedance connecting between adjacent ones of said plurality of transmission line sections when open, and a low impedance connection when closed, the opening and closing of said first switching means being a function of the current flowing through said first switching means;
 means for charging each of said transmission line sections to a prescribed voltage potential, whereby all of said transmission line sections are charged to the same prescribed voltage potential; and
 second switching means for selectively connecting a first transmission line section of said plurality of transmission line sections to said load after said charging means has charged all of said transmission line sections to said prescribed voltage potential;
 a first pulse being developed across said load at the time said second switch means connects the first transmission line section to said load, the pulse width of said first pulse being a function of the length of the first transmission line section, the pulse amplitude of said first pulse being a function of the prescribed voltage potential to which said transmission line sections are charged; and
 a first voltage being respectively developed across the first switching means connecting adjacent transmission line sections of said plurality of transmission line sections after the prescribed voltage potential on one of said transmission line sections has been discharged as a pulse to said load, said first voltage causing a sufficiently high current to flow through said first switching means to close said first switching means within a switching time, said closed first switching means thereby connecting the prescribed voltage potential on the other of said adjacent transmission line sections through said closed switch to the one of said transmission line sections that has been discharged, whereupon a second pulse is developed across said load at the conclusion of said switching time in the same manner as said first pulse was developed across said load at the time said second switching means was closed; and
 additional pulses being developed across aid load in the same manner as were said first and second pulses for each additional transmission line section of said plurality of transmission line sections, with each pulse being developed one switching time subsequent to the prior pulse;
 whereby multiple pulses are developed across said load upon the single closure of said second switching means.

2. The pulse burst generator as set forth in claim 1 wherein said first switching means comprises a saturable inductor.

3. The pulse burst generator as set forth in claim 2 wherein each of said saturable inductors exhibit hysteresis, said hysteresis being characterized by a particular B-H transfer function, an operating point of said B-H transfer function defining whether said saturable inductor provides a high impedance connection or a low impedance connection.

4. The pulse burst generator as set forth in claim 3 further including resetting means for resetting each of said saturable inductors to a desired starting operating point of the particular B-H transfer function for each excursion from a high impedance connection to a low impedance connection and back to a high impedance connection.

5. The pulse burst generator as set forth in claim 1 wherein said second switching means comprises a switch selected from a group of switches comprising a silicone controlled rectifier (SCR), a spark gap switch, a photo conductor switch, and a thyratron.

6. The pulse burst generator as set forth in claim 1 wherein each of said transmission line sections comprises a prescribed length of coaxial cable.

7. The pulse burst generator as set forth in claim 1 wherein said transmission line sections comprise a Blumlein transmission line configuration.

8. The pulse burst generator as set forth in claim 7 wherein said Blumlein transmission line configuration includes a first conductor, a second conductor, and a third conductor; said second switching means coupling one end of said second conductor to one end of said third conductor; said load being connected between the other end of said third conductor and one end of said first conductor, the other ends of said first and second conductors being open; and said charging means charging said second conductor with said voltage potential relative to said first conductor.

9. The pulse burst generator as set forth in claim 8 wherein said first switching means comprises a saturable inductor inserted between adjacent segments of said second conductor, each segment of said second conductor having a corresponding segment of said first and third conductors, corresponding segments of said first, second and third conductors defining one of said plurality of transmission line sections.

10. A pulse burst generator comprising:
a plurality of transmission line sections, each having substantially the same characteristic impedance;
means for forming a series combination of said transmission line sections, said series combination forming means coupling said transmission line sections via a high impedance connection when the current flowing through the series combination is low, and a low impedance connection when the current flowing through the series combination is high;
switch means for selectively connecting a first section of said series combination to a load, said load having an impedance approximately equal to the characteristic impedance of said transmission line sections;
charging means for charging said series combination to a prescribed voltage potential; and
control means for selectively activating said switch means at a time subsequent to the charging of said series combination to connect said first section of said series combination to said load, a burst of pulses being delivered to said load from the charged series combination when said switch means is closed, and for selectively deactivating said switch means after said burst of pulses has been delivered to said load to disconnect said first section of said series combination from said load, said series combination thereafter being charged to said prescribed voltage by said charging means in anticipation of a next delivery of a burst of pulses to said load.

11. The pulse burst generator as set forth in claim 10 wherein said series combination forming means includes a saturable inductor connected between adjacent transmission line sections.

12. The pulse burst generator as set forth in claim 11 wherein each of said saturable inductors have a B-H transfer function that exhibits hysteresis.

13. The pulse burst generator as set forth in claim 12 further including reset means for resetting each saturable inductor to a desired starting point of its respective B-H transfer function for each excursion from a high impedance to a low impedance and back to a high impedance.

14. The pulse burst generator as set forth in claim 10 wherein each of said transmission line sections comprise a length of coaxial cable.

15. The pulse burst generator as set forth in claim 14 wherein said series combination means includes at least one saturable inductor embedded within a section of coaxial cable, said saturable inductor including a toroid core through which a center conductor of said coaxial cable passes, said toroid core defining a boundary between said transmission line sections.

16. The pulse burst generator as set forth in claim 10 wherein each of said transmission line sections comprise a Blumlein arrangement of transmission line conductors.

17. The pulse burst generator as set forth in claim 16 wherein said Blumlein arrangement of transmission line conductors includes a first conductor, a second conductor, and a third conductor; said switch means coupling one end of said second conductor to one end of said third conductor; said load being connected between the other end of said third conductor and one end of said first conductor, the other ends of said first and second conductors being open; and said charging means charging said second conductor with said voltage potential relative to said first conductor.

18. The pulse burst generator as set forth in claim 17 wherein said series combination means comprises a saturable inductor inserted between adjacent segments of said second conductor, each segment of said second conductor having corresponding segments of said first and third conductors, corresponding segments of said first, second and third conductors defining one of said plurality of transmission line sections.

19. A method of generating a burst of high energy pulses, said method comprising the steps of:
(a) connecting a prescribed number of transmission line sections and saturable inductors to form said series combination including one of said saturable inductors between adjacent coaxial cable sections;
(b) charging said series combination to a prescribed voltage; and
(c) connecting said series combination, after being charged to said prescribed voltage, to a desired load, the charge in said series combination being transferred to said load in pulses, a first pulse comprising the charge held in a first coaxial cable section adjacent said load, a second pulse comprising the charge held in a second coaxial cable section coupled to said load through a first saturable inductor and said first coaxial cable section, and so on, with the number of pulses being equal to the number of coaxial cable sections in said series combination.

20. The method set forth in claim 19 wherein said saturable inductors include a B-H transfer function that exhibits hysteresis, and further wherein said method includes resetting the B-H transfer function to a desired starting point prior to coupling each one of said pulses therethrough.

* * * * *

UNITED STATES PATENT AND TRADEMARK OFFICE
CERTIFICATE OF CORRECTION

PATENT NO. : 5,118,969
DATED : June 2, 1992
INVENTOR(S) : Ikezi, et al.

It is certified that error appears in the above-identified patent and that said Letters Patent is hereby corrected as shown below:

Column 6, line 7, change "L1" to --$L_1$--.
Column 7, line 52, after "selecting the" insert --number and length of the transmission line sections, the--.
Column 8, lines 27, 33, 36, 47 and 53, change "l" to --$\ell$--.
Column 8, line 55, after "magnetic" insert --field--.
Column 9, line 46, change "l to --$\ell$--.
Column 10, line 24, change "la" to --$\ell$a--.
Column 10, line 27, change "l" to --$\ell$--.
Column 10, line 46, change "l=70mm." to --$\ell$=70mm.--.
Column 10, line 52, change "$B_s^2$la" to --$B_s^2\ell$a--.
Column 10, line 53, change "$B_0^2$la" to --$B_0^2\ell$a--.

Column 13, lines 65-66, change "connecting" to --connection--.
Column 14, line 40, change "aid" to --said--.

Signed and Sealed this

Thirty-first Day of August, 1993

Attest:

BRUCE LEHMAN

*Attesting Officer*    *Commissioner of Patents and Trademarks*